(12) United States Patent
Wang et al.

(10) Patent No.: US 6,569,349 B1
(45) Date of Patent: May 27, 2003

(54) ADDITIVES TO CMP SLURRY TO POLISH DIELECTRIC FILMS

(75) Inventors: Yuchun Wang, San Jose, CA (US); Rajeev Bajaj, Fremont, CA (US); Fred C. Redeker, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/694,866

(22) Filed: Oct. 23, 2000

(51) Int. Cl.[7] ............................................. C09K 13/00
(52) U.S. Cl. .................... 252/79.1; 252/79.2; 252/79.4; 252/79.5
(58) Field of Search ............................... 438/690, 691, 438/692; 252/79.1, 79.2, 79.4, 79.5

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 4,867,757 A | 9/1989 | Payne | 51/293 |
| 5,264,010 A | 11/1993 | Brancaleoni et al. | 51/308 |
| 5,476,411 A | 12/1995 | Held, III | 451/36 |
| 5,614,444 A | 3/1997 | Farkas et al. | 437/225 |
| 5,700,383 A | 12/1997 | Feller et al. | 216/88 |
| 5,738,574 A | 4/1998 | Tolles et al. | 451/288 |
| 5,738,800 A | 4/1998 | Hosali et al. | 216/99 |
| 5,756,398 A | 5/1998 | Wang et al. | 438/692 |
| 5,769,689 A | 6/1998 | Cossaboon et al. | 451/41 |
| 5,770,095 A | 6/1998 | Sasaki et al. | 216/38 |
| 5,840,629 A | 11/1998 | Carpio | 438/692 |
| 5,866,031 A | 2/1999 | Carpio et al. | 252/79.1 |
| 5,876,508 A | 3/1999 | Wu et al. | 134/2 |
| 5,911,835 A | 6/1999 | Lee et al. | 134/1.3 |
| 5,932,486 A | 8/1999 | Cook et al. | 438/692 |
| 5,958,794 A | 9/1999 | Bruxvoort et al. | 438/692 |
| 5,981,454 A | 11/1999 | Small | 510/175 |
| 5,985,748 A | 11/1999 | Watts et al. | 438/622 |
| 6,033,993 A | 3/2000 | Love, Jr. et al. | 438/745 |
| 6,039,891 A | 3/2000 | Kaufman et al. | 252/79.1 |
| 6,042,741 A | 3/2000 | Hosali et al. | 252/79.1 |
| 6,043,155 A | 3/2000 | Homma et al. | 438/691 |
| 6,046,110 A | 4/2000 | Hirabayashi et al. | 438/693 |
| 6,054,379 A | 4/2000 | Yau et al. | 438/623 |
| 6,068,879 A | 5/2000 | Pasch | 427/97 |

(List continued on next page.)

FOREIGN PATENT DOCUMENTS

| | | | |
|---|---|---|---|
| EP | 0 659 858 A2 | 6/1995 | C09G/1/02 |
| EP | 0 846 742 A2 | 6/1998 | C09G/1/02 |
| EP | 0 913 442 A2 | 5/1999 | C09G/1/02 |
| WO | WO 98/49723 | 11/1998 | H01L/21/321 |
| WO | 00/00561 | 1/2000 | C09G/1/02 |
| WO | WO 00/30159 | 5/2000 | H01L/21/00 |
| WO | WO 00/36037 | 6/2000 | C09G/1/02 |
| WO | WO 00/49647 | 8/2000 | H01L/21/302 |
| WO | WO 00/53691 | 9/2000 | |

OTHER PUBLICATIONS

U.S. patent application Ser. No. 09/247,381, Cheung et al., filed Feb. 10, 1999.
U.S. patent application Ser. No. 09/401,643, Li et al., filed Sept. 22, 1999.
U.S. patent application Ser. No. 09/,469,708, Li et al., filed Dec. 21,1999.
U.S. patent application Ser. No. 09/543,777, Sun et al., filed Apr. 5, 2000.

(List continued on next page.)

Primary Examiner—Benjamin L. Utech
Assistant Examiner—Binh X. Tran
(74) Attorney, Agent, or Firm—Moser, Patterson & Sheridan

(57) ABSTRACT

A method and composition for planarizing a substrate. The composition includes one or more chelating agents, one or more oxidizers, one or more corrosion inhibitors, a polar solvent, and deionized water. The composition may further comprise one or more surfactants, one or more agents to adjust the pH and/or abrasive particles. The method comprises planarizing a substrate using a composition including a polar solvent.

5 Claims, 2 Drawing Sheets

U.S. PATENT DOCUMENTS

| | | | |
|---|---|---|---|
| 6,074,949 A | 6/2000 | Schonauer et al. | 438/692 |
| 6,077,337 A | 6/2000 | Lee | 106/3 |
| 6,083,840 A | 7/2000 | Mravic et al. | 438/693 |
| 6,096,652 A | 8/2000 | Watts et al. | 438/692 |
| 6,099,394 A | 8/2000 | James et al. | 451/72 |
| 6,117,775 A | 9/2000 | Kondo et al. | 438/690 |
| 6,117,783 A | 9/2000 | Small et al. | 438/693 |
| 6,121,143 A | 9/2000 | Messner et al. | 438/692 |
| 6,156,661 A | 12/2000 | Small | 438/692 |
| 6,159,076 A | 12/2000 | Sun et al. | 451/36 |
| 6,187,216 B1 * | 2/2001 | Dryer et al. | 216/95 |
| 6,194,317 B1 | 2/2001 | Kaisaki et al. | 438/692 |
| 6,217,416 B1 | 4/2001 | Kaufman et al. | 451/41 |
| 6,238,592 B1 * | 5/2001 | Hardy et al. | 252/79.1 |
| 6,241,586 B1 | 6/2001 | Yancey | 451/41 |
| 6,258,721 B1 | 7/2001 | Li et al. | 438/693 |
| 6,270,393 B1 * | 8/2001 | Kubota et al. | 451/36 |
| 6,277,015 B1 | 8/2001 | Robinson et al. | 451/528 |
| 6,348,076 B1 * | 2/2002 | Canaperi et al. | 51/309 |
| 6,348,725 B2 | 2/2002 | Cheung et al. | |
| 6,383,934 B1 * | 5/2002 | Sabde et al. | 438/692 |
| 6,420,327 B1 * | 7/2002 | Machac et al. | 510/201 |
| 6,447,563 B1 * | 9/2002 | Mahulikar | 51/309 |

OTHER PUBLICATIONS

U.S. patent application Ser. No. 09/544,281, Sun et al., filed Apr. 6, 2000.

U.S. patent application Ser. No. 09/606,544, Sun et al., filed Jun 30, 2000.

U.S. patent application Ser. No. 09/608,078, Sun et al., filed Jun.30, 2000.

U.S. patent application Ser. No. 09/694,866, Wang et al., filed Oct. 23,2000.

U.S. patent application Ser. No. 09/698,863, Tsai et al., filed Oct. 27, 2000.

U.S. patent application Ser. No. 09/698,864, Li et al., filed Oct. 27, 2000.

U.S. patent application Ser. No. 09/569,986, Sun et al., filed Nov. 12, 2000.

U.S. patent application Ser. No. 09/741,538, Li et al., filed Dec. 20, 2000.

U.S. Ser. No. 09/421,452 entitled "Elimination of Pad Glazing for All CMP", filed Oct. 19, 1999 to Sun, et al.

* cited by examiner

US 6,569,349 B1

ADDITIVES TO CMP SLURRY TO POLISH DIELECTRIC FILMS

BACKGROUND OF THE INVENTION

1. Field of the Invention

The invention relates generally to the fabrication of semiconductor devices and to polishing and planarizing of substrates.

2. Background of the Related Art

Reliably producing sub-half micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors and dielectric materials having a low dielectric constant (low k, defined herein as having dielectric constants, k, less than about 4) as insulating layers to reduce the capacitive coupling between adjacent interconnects. Increased capacitative coupling between layers can detrimentally affect the operation of semiconductor devices.

As such, low resistivity materials, such as copper, and low k dielectric materials, such as carbon doped silicon oxides or other organic-inorganic dielectric materials, are being used to form semiconductor features. For example, copper is utilized in dual damascene structures where vertical and horizontal interconnects of a dual damascene feature definition are etched out of the low k material. A diffusion barrier material and then are deposited therein, and the upper surface of the substrate is polished to form the dual damascene feature. Polishing removes both the copper and the low k dielectric material to produce a planarized surface suitable for further processing of the substrate. As a result, chemical mechanical polishing is being used to provide planarization of the substrate, and new processes and compositions are being developed to improve removal of substrate materials, such as the low k dielectric materials.

Conventionally, in polishing copper features, such as in a dual damascene structure, the copper material is polished to the barrier layer, and then the barrier layer is polished to the underlying dielectric layer to form the dual damascene feature. One challenge which is presented in polishing dielectric materials is that dielectric materials are often removed at different rates in comparison to the copper material and barrier material with different compositions and in different applications. For example, in a selective polishing process during barrier removal for copper damascene structures, a high barrier removal rate and low dielectric removal rate is desired to minimize total metal loss. In a non-selective process, a high removal rate of both the barrier layer and the low k dielectric material is desired to achieve good planarization. In other applications, such as where the logic and memory chips are integrated, a much higher removal rate of the low k dielectric films in comparison to the surrounding material is needed. Conventional compositions typically remove dielectric materials at relatively low rates compared to surrounding materials, such as conductive materials or metals.

Therefore, there exists a need for a method and related polishing composition which facilitates the removal of dielectric materials at desired rates for different manufacturing applications.

SUMMARY OF THE INVENTION

The invention generally provides a method and composition for planarizing a substrate surface with controllable removal rates of low k dielectric materials. In one aspect, the invention provides a composition for planarizing a substrate, the composition comprising one or more chelating agents, one or more oxidizers, one or more corrosion inhibitors, a polar solvent, and deionized water. The composition may further include one or more surfactants, one or more agents to adjust the pH of the composition. The CMP composition may also include an abrasive particle concentration of about 10 wt. % or less.

In another aspect, the invention provides a method for removing at least a portion of a material from a substrate surface, the method comprising planarizing the substrate surface using a composition including a polar solvent. The composition further comprises one or more surfactants, one or more chelating agents, one or more oxidizers, one or more corrosion inhibitors, deionized water, and may optionally include one or more agents to adjust the pH of the composition and/or abrasive particles.

Another aspect of the invention provides a method for processing a substrate, comprising forming an aperture in a low k dielectric layer disposed on the surface of a substrate, depositing a barrier layer on the dielectric layer and in the aperture, depositing a metal layer on the barrier layer to fill the aperture, and planarizing the substrate using a composition including, a polar solvent, one or more chelating agents, one or more oxidizers, one or more corrosion inhibitors, and deionized water. The method may further include a composition further containing one or more surfactants, one or more agents to adjust the pH of the composition or abrasive particles.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to a planarizing process and composition that can be carried out using chemical mechanical polishing process equipment, such as the Mirra® CMP System available from Applied Materials, Inc., as shown and described in U.S. Pat. No. 5,738,574, entitled, "Continuous Processing System for Chemical Mechanical Polishing," the entirety of which is incorporated herein by reference to the extent not inconsistent with the invention.

Although, the CMP process and composition is illustrated utilizing the Mirra® CMP System, any system enabling chemical mechanical polishing using the composition described herein can be used to advantage. Examples of other suitable apparatus include the Obsidian 8200C System available from Applied Materials, Inc., or a linear polishing system, using a sliding or circulating polishing belt or similar device. An example of a linear polishing system is more fully described in co-pending U.S. patent application Ser. No. 09/244,456, filed on Feb. 4, 1999, and incorporated herein by reference to the extent not inconsistent with the invention. The following apparatus description is illustrative and should not be construed or interpreted as limiting the scope of the invention.

Figure 1:
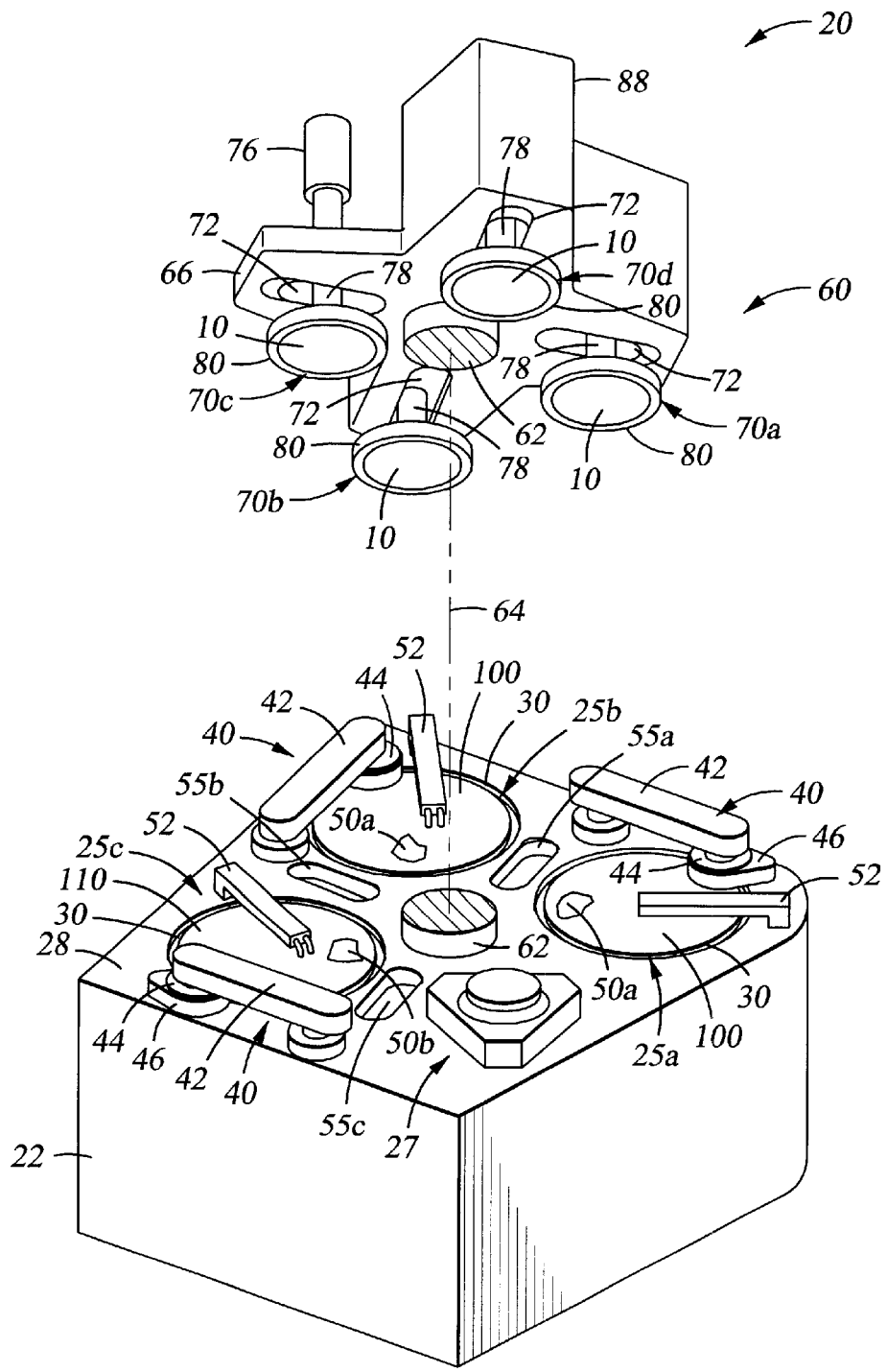
FIG. 1 is a schematic perspective view of a chemical mechanical polishing apparatus.

FIG. 1 is a schematic perspective view of a chemical mechanical polishing apparatus 20. The polishing apparatus 20 includes a lower machine base 22 with a table top 28 mounted thereon and a removable outer cover (not shown). The table top 28 supports a series of polishing stations, including a first polishing station 25a, a second polishing station 25b, a final polishing station 25c, and a transfer station 27. The transfer station 27 serves multiple functions, including, for example, receiving individual substrates 10 from a loading apparatus (not shown), washing the substrates, loading the substrates into carrier heads 80, receiving the substrates 10 from the carrier heads 80, washing the substrates 10 again, and transferring the substrates 10 back to the loading apparatus.

Each polishing station 25a–25c includes a rotatable platen 30 having a polishing pad 100 or 110 disposed thereon. Each platen 30 may be a rotatable aluminum or stainless steel plate connected to a platen drive motor (not shown). The polishing stations 25a–25c may include a pad conditioner apparatus 40. The pad conditioner apparatus 40 has a rotatable arm 42 holding an independently rotating conditioner head 44 and an associated washing basin 46. The pad conditioner apparatus 40 maintains the condition of the polishing pad so that it will effectively polish the substrates. Each polishing station may include a conditioning station if the CMP apparatus is used with other pad configurations.

The polishing stations 25a–25c may each have a slurry/rinse arm 52 that includes two or more supply tubes to provide one or more chemical slurries and/or water to the surface of the polishing pad. The slurry/rinse arm 52 delivers the one or more chemical slurries in amounts sufficient to cover and wet the entire polishing pad. Each slurry/rinse arm 52 also includes several spray nozzles (not shown) that can provide a high-pressure fluid rinse on to the polishing pad at the end of each polishing and conditioning cycle. Furthermore, two or more intermediate washing stations 55a, 55b, and 55c may be positioned between adjacent polishing stations 25a, 25b, and 25c to clean the substrate as it passes from one station to the next.

A rotatable multi-head carousel 60 is positioned above the lower machine base 22. The carousel 60 includes four carrier head systems 70a, 70b, 70c, and 70d. Three of the carrier head systems receive or hold the substrates 10 by pressing them against the polishing pads 100 or 110 disposed on the polishing stations 25a–25c. One of the carrier head systems 70a–70d receives a substrate from and delivers a substrate 10 to the transfer station 27. The carousel 60 is supported by a center post 62 and is rotated about a carousel axis 64 by a motor assembly (not shown) located within the machine base 22. The center post 62 also supports a carousel support plate 66 and a cover 68.

The four carrier head systems 70a–70d are mounted on the carousel support plate 66 at equal angular intervals about the carousel axis 64. The center post 62 allows the carousel motor to rotate the carousel support plate 66 and orbit the carrier head systems 70a–70d about the carousel axis 64.

Each carrier head system 70a–70d includes one carrier head 80. A carrier drive shaft 78 connects a carrier head rotation motor 76 (shown by the removal of one quarter of the cover 68) to the carrier head 80 so that the carrier head 80 can independently rotate about its own axis. There is one carrier drive shaft 74 and motor 76 for each head 80. In addition, each carrier head 80 independently oscillates laterally in a radial slot 72 formed in the carousel support plate 66.

The carrier head 80 performs several mechanical functions. Generally, the carrier head 80 holds the substrate 10 against the polishing pad 100 or 110, evenly distributes a downward pressure across the back surface of the substrate 10, transfers torque from the drive shaft 78 to the substrate 10, and ensures that the substrate 10 does not slip out from beneath the carrier head 80 during polishing operations.

Chemical Mechanical Polishing Process and Composition.

A planarizing process and composition is provided to control the polishing of organic-inorganic dielectric materials that may have low dielectric constants. Organic-inorganic dielectric materials are broadly defined herein as materials having both organic and inorganic components or organic and inorganic bonds, such as carbon doped silicon oxides. The process and composition may be used in a chemical mechanical planarization, or chemical mechanical polishing (CMP) technique to planarize substrates. CMP is broadly defined herein as polishing a substrate by chemical activity, mechanical activity, or a combination of both chemical and mechanical activity.

In one aspect of the invention, one or more surfactants and a polar solvent are added to a chemical mechanical polishing composition. Such a composition includes the one or more surfactants, one or more chelating agents, one or more oxidizers, one or more corrosion inhibitors, the polar solvent, and deionized water. The composition may also further include one or more pH adjusting agents and/or abrasive particles. In one embodiment of the composition, only a polar solvent is added. Alternatively, only the one or more surfactants are added to the composition.

Surfactants useful in the composition include those which decrease the removal rate of dielectric materials. The surfactants may include anionic surfactants, cationic surfactants, non-ionic, and combinations thereof. Anionic surfactants and cationic surfactants may have more than one anion or cation species, such as dowfax™, a bi-anion surfactant. Surfactants are described broadly herein as chemical compounds which reduce the surface tension of a composition, or slurry, applied to a substrate during a CMP process.

Examples of surfactants include non-ionic surfactants, such as polyethylene oxide, polyethylene oxide derivatives, and polyoxyalkalene alkylphenyl ethers, such as Waco NCW-601A. Examples of anionic surfactants include dodecyl benzene sulfate, sodium dodecyl sulfate, sodium salts of polyacrylic acid (comprising weights between about 1,000 and about 20,000), zinc stearate, and dowfax™ Examples of cationic surfactants include ammonia based salts, amine based surfactants including benzylamine and octylamine and ammonia based surfactants including poly(bis(2-chloroethyl)ether-alt-1,3-bis(3-(dimetylamino)propyl)urea, and poly(diallydimethylammonium chloride), and combinations thereof. It is contemplated that other surfactants, including Zweitter surfactants and dispersers, or multi-ionic surfactants, which may reduce dielectric removal rate may also be used in the composition and method described herein. The above described surfactants are illustrative and should not be construed or interpreted as limiting the scope of the invention.

The one or more surfactants can comprise a concentration between about 0.001 volume percent (vol %) and about 10 vol % of the composition. A concentration between about 0.1 vol % and about 1 vol % of the surfactants is used in one embodiment of the composition. In one aspect of the composition, the one or more surfactants may not be present in the composition to allow for improved or to maximize removal of the dielectric material.

The surfactants are useful in reducing the removal rate of dielectric materials having an organic aspect, such as a C—H or Si—C bond, and an inorganic aspect, such as a Si—O bond. Dielectric materials having organic and inorganic aspects may have low dielectric constants and include, for example, carbon doped silicon oxides (SiOC), which can be deposited by chemical vapor deposition processes. An example of an organic-inorganic dielectric material is a silicon oxide film containing silicon-carbon bonds deposited from organosilane and organosiloxane precursors in a plasma-enhanced CVD process and is disclosed in U.S. Pat. No. 6,054,379, entitled "Method of Depositing a Low K Dielectric With Organosilane," issued on Apr. 25, 2000 and in co-pending U.S. patent application Ser. No. 09/247,381, entitled "Plasma Process For Depositing Dielectric Constant Films," filed on Feb. 10, 1999, both of which are assigned to Applied Materials, Inc., and is incorporated herein by reference to the extent not inconsistent with the invention.

The polar solvent can be any alcohol, ketone, ether, or other polar reagent at least partially soluble in the composition. Examples of polar solvents include alcohols, such as isopropyl alcohol, ketones, such as acetone, ethers, such as diethylether, and tetrahydrofuran (THF). The polar solvent can comprise a concentration between about 0.001 volume percent (vol %) and about 33 vol % of the composition. In one aspect of the composition, the polar solvent may comprise up to about 70 vol % of the composition. A concentration between about 5 vol % and about 10% of the polar solvent is used in one embodiment of the composition. The polar solvents increase the solubility of the polishing by-product of organic and inorganic dielectric materials in the composition. In one aspect of the composition, the polar solvent may not be present in the composition to allow for reduced or to minimize removal of the dielectric material.

The one or more chelating agents may include one or more amine or amide groups, such as ethylenediaminetetraacetic acid, ethylenediamine or methylformamide, or organic acids, such as iminodiacetic acid or oxalic acid. The one or more chelating agents can be present in an amount between about 0.2 vol % and about 3.0 vol % of the CMP composition. The chelating agent chemically reacts with metal ions removed from the polished surface to form a soluble metal complex to minimize re-deposition of metal ions on the surface of the substrate.

The oxidizers can be any of various conventional oxidizers employed in CMP compositions and processes, such as hydrogen peroxide, ferric nitride, peracetic acid, or other compounds such as iodates. The oxidizers can be present in an amount between about 0.01 vol % and about 8.0 vol % of the CMP composition.

Examples of corrosion inhibitors include any various organic compounds containing an azole group, such as benzotriazole, mercaptobenzotriazole, or 5-methyl-1-benzotriazole. The corrosion inhibitors can be present in an amount between about 0.02 vol % and about 1.0 vol % of the CMP composition.

The composition may further include one or more pH adjusting agents. The pH adjusting agent or agents can be present in an amount sufficient to adjust the pH of the CMP composition to a range between about 2.5 and about 11 and can comprise any of various bases, such as potassium hydroxide (KOH) and ammonium hydroxide, or inorganic and/or organic acids, such as acetic acid, phosphoric acid, or oxalic acid. However, other chelating agents, oxidizers, corrosion inhibitors, and pH adjusting agents are contemplated for use with the invention. The above specified components are illustrative and should not be construed as limiting the invention.

In one embodiment of the composition described above, the surfactants and polar solvents are used in a CMP abrasive-free polishing composition with a conventional polishing pad. Alternatively, embodiments of the invention may include adding abrasive particles to polishing compositions containing the one or more surfactants described herein for planarizing a substrate surface. The compositions containing abrasives particles may comprise an abrasive particle concentration of about 10 wt. % or less of the composition. Alternatively, a concentration between about 1 wt. % or less of abrasive particles is included in CMP compositions containing the one or more surfactants and the polar solvent described herein. One example of a CMP composition having abrasive particles includes a colloidal suspension of silicon oxide particles, with an average size of about 50 nm. Other abrasive components which may be used in CMP compositions include, but are not limited to, alumina ($Al_2O_3$), silica ($SiO_2$), titania ($TiO_2$), or ceria ($CeO_2$) particles, or any other abrasives known in the art and used in conventional CMP compositions.

The CMP compositions and processes described herein can additionally polish and planarize metal layers, including layers comprised of copper, copper alloys, doped copper, aluminum, doped aluminum, nickel, doped nickel, tantalum, tantalum nitride, tungsten, tungsten nitride, titanium, titanium nitride, and combinations thereof. It is further contemplated that other materials, including titanium-tungsten (TiW), titanium silicon nitride (TiSiN), tantalum silicon nitride (TaSiN), tungsten silicon nitride (WSiN), and silicon nitride used for forming barrier layers with conductive materials, such as copper, may be polished and planarized using the compositions described herein.

In practice, it is believed that the surfactants of the CMP composition are absorbed onto the organic-inorganic dielectric materials, with the surfactant performing as a lubrication material to reduce mechanical polishing of the material. By controlling the type and concentration of the one or more surfactants in the composition, the removal rate of the dielectric layer with respect to a reduced removal rate can be controlled.

It is further believed that the polar solvents of the CMP composition, in particular organic solvents, increase the removal rate of the organic-inorganic dielectric materials by increasing the solubility of the polishing by-product of these material. By controlling the type and concentration of the polar solvent in the composition, the removal rate of the dielectric layer with respect to an increased removal rate can be controlled. A balance of polar solvent and surfactants concentrations can allow desired removal rates of the dielectric material in CMP processing.

EXAMPLE

An example of an abrasive-free CMP composition described herein includes between about 0.1 vol % and about 1 vol % of polyethylene oxide or polyethylene oxide derivative, between about 0.3 vol % and about 3 vol % of ethylenediamine, between about 0.5 vol % and about 5.0 vol % hydrogen peroxide, between about 0.02 vol % and about 0.1 vol % benzotriazole, about 5 vol % isopropyl alcohol, phosphoric acid as a pH adjusting agent to produce a pH level between about 4 and about 8, and distilled water.

One example of an abrasive-free CMP process employs using the above described composition in the apparatus described above and shown in FIG. 1 by using a polishing pressure between about 1 and about 8 psi, and a platen speed between about 20 and about 120 rpm for a polishing duration between about 30 seconds and about 2,000 seconds to planarize a substrate.

Figure 2:
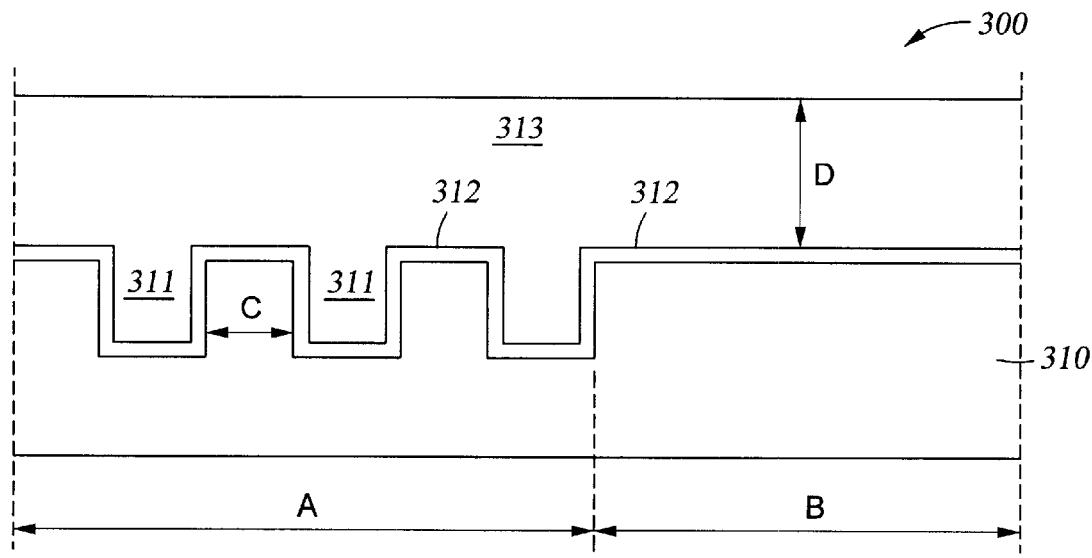
FIGS. 2–4 are schematic diagrams illustrating one embodiment of a process for forming a feature on a substrate.
Figure 3:
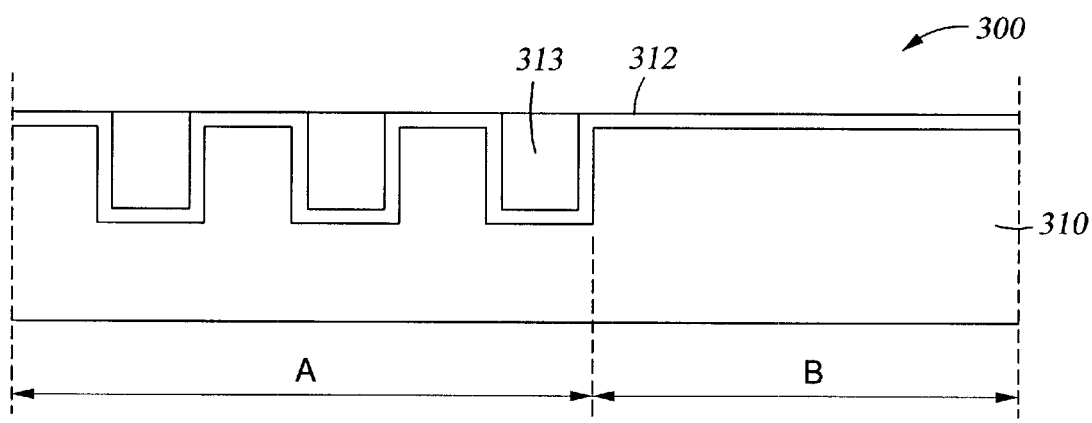
Figure 4:
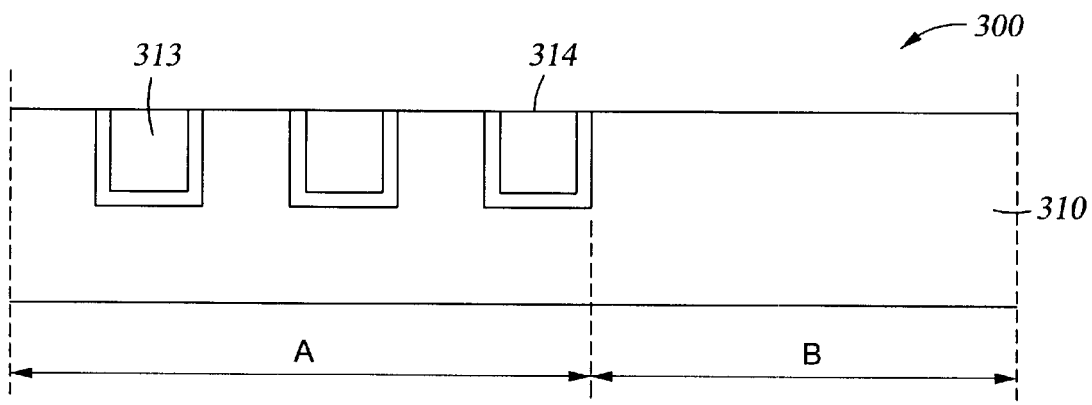

FIGS. 2–4 are schematic diagrams illustrating one embodiment of a process for forming a feature on a substrate utilizing the invention described herein.

FIG. 2 is a schematic cross-sectional view of an example of one type of feature formed on a substrate which requires planarization. The substrate includes a dielectric layer 310, such as a silicon oxide or a carbon-doped silicon oxide, is formed on a substrate 300. A plurality of apertures 311, such as vias, trenches, or holes, are patterned and etched into the dielectric layer 310 in area A forming features for a dense array of conductive lines with area B being unetched. Typically, the openings 311 are spaced apart by a distance C which can be less than about 1 micron, such as about 0.2 micron, or greater than 10 microns, such as 20 microns. The openings 311 may be formed in the dielectric layer 310 by conventional photolithographic and etching techniques. A barrier layer 312 of a conductive material, such as tantalum (Ta) or tantalum nitride (TaN) for a copper metallization, is disposed conformally in the openings 311 and on the upper surface of the dielectric layer 310. A conductive material layer 313, such as copper, is disposed on the barrier layer at a thickness (D), which may be a thickness between about 8,000Å and about 18,000 Å.

The dielectric layer 410 may comprise any of various dielectric materials conventionally employed in the manufacture of semiconductor devices. Organic-inorganic dielectric materials may be used, and include silicon dioxide derived from organic precursors, such as tetraethyl orthosilicate (TEOS) or trimethylsilane, by thermal or plasma enhanced chemical vapor deposition (PECVD). The invention also contemplates the use of other dielectric materials, such as silicon dioxide, phosphorus-doped silicon glass (PSG), boron-phosphorus-doped silicon glass (BPSG), and low dielectric constant materials, including fluoro-silicon glass (FSG), polymers, such as polyamides, and carbon-containing silicon dioxide.

One type of barrier layer 412 comprises tantalum, tantalum nitride, or combinations thereof. As used throughout this disclosure, the word "tantalum" and the symbol "Ta" are intended to encompass tantalum, tantalum nitride, and combinations thereof. The invention also contemplates the use of tantalum alloys and tantalum containing compounds, such as tantalum silicon nitride, which may be used as barrier materials. The invention also contemplates the use of other barrier materials for copper conventionally known in the art.

One type of conductive material layer 413 comprises copper containing materials. Copper containing materials include copper, copper alloys (e.g., copper-based alloys containing at least about 80 weight percent copper), or doped copper. As used throughout this disclosure, the phrase "copper containing material," the word "copper," and the symbol "Cu" are intended to encompass copper, copper alloys, doped copper, and combinations thereof.

Referring to FIG. 3, the substrate is exposed to a CMP process employing utilizing a first polishing composition comprising to remove at least a portion of the copper layer 313 with high selectivity to TaN barrier layer 312 to stop thereon. A high selectivity to the TaN barrier layer allows for removal of substantially all of the copper layer while minimizing removal of the TaN layer. The one or more surfactants and/or the polar solvent can be added to the first polishing composition to increase removal or decrease removal of any dielectric layer exposed and polished in this process.

Referring to FIG. 4, a second CMP process using a second CMP composition suitable for planarizing TaN and the underlying dielectric material can then be performed to remove the TaN barrier layer 312 and to remove or reduce scratching or defects formed in the dielectric layer on the substrate surface, thereby completing planarization. The one or more surfactants and/or the polar solvent can be added to the second polishing composition to increase removal or decrease removal of any dielectric layer exposed and polished in this process to complete planarization.

The CMP process may also be conducted in one stage to remove the copper layer, the barrier layer, and a portion of the dielectric layer formed on the surface of the substrate 300 to form the features utilizing the CMP composition described herein including the one or more surfactants and/or the polar solvent. In either CMP process, the resulting copper features comprises a dense array (A) of copper lines 313 bordered by open field B and the planar surface 314 of the copper metallization and substrate 300.

It has been observed that the resulting features formed in the dielectric materials with the CMP compositions described herein exhibit improved planarization at desired polishing rates for various applications. The CMP composition containing the one or more surfactants and polar solvent produced an improved polish quality without detrimentally affecting the performance of the CMP composition. The compositions described herein have been advantageously used in removing dielectric materials, such as carbon doped silicon oxide, deposited as the dielectric layer on substrate surfaces and used to form features therein.

Table 1, shown below, demonstrates the effect of surfactants and polar solvents on one CMP composition. The CMP composition is Cu-10K, a barrier removal silica-based slurry capable of removing dielectric materials. Cu-10K is available from Arch Chemical of Michigan. The CMP composition was used to remove material from a substrate comprising a low k dielectric layer formed from the plasma enhanced deposition of a organosilicon precursor, a barrier layer of tantalum deposited on features formed in the low k dielectric layer, and copper deposited on the barrier layer to fill the features formed in the low k dielectric material.

The deposition of the low k dielectric layer is more fully described in U.S. Pat. No. 6,054,379, entitled "Method of Depositing a Low K Dielectric With Organosilane," issued on Apr. 25, 2000 and in co-pending U.S. patent application Ser. No. 09/247,381, entitled "Plasma Process For Depositing Dielectric Constant Films," filed on Feb. 10, 1999, and is incorporated herein by reference to the extent not inconsistent with the composition and process described herein.

The copper layer was removed using a CMP composition suitable for the removal of copper. The tantalum barrier layer and the dielectric layer were then removed using Cu-10K and 1) 300 ppm of NCW™, a non-ionic surfactant, 2) no surfactant or polar additives, 3) 10 vol % of acetone, 4) 20 vol % of acetone, and 3) 33 vol % of acetone. The respective removal rates of the CMP composition is shown in Table 1, below.

TABLE 1

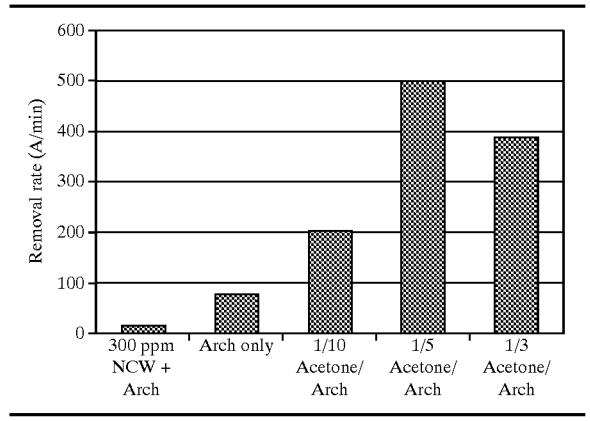

As shown from Table 1, the addition of a surfactant reduced the removal rate of the dielectric material. The addition of the polar solvent improved the removal rate of the dielectric material between a factor of about 3 and about 5.

The invention described herein is applicable to planarizing a substrate surface during various stages of semiconductor manufacturing by any of various CMP techniques using any of various CMP systems and polishing articles, such as fixed abrasive or abrasive slurry-type pads or sheets. The invention described herein enjoys particular applicability in the manufacture of high density semiconductor devices with metal features in the deep submicron range.

While the foregoing is directed to the one or more embodiments of the invention, other and further embodiments of the invention may be devised without departing from the basic scope thereof, and the scope thereof is determined by the claims that follow including their equivalents.

What is claimed is:

1. A composition for planarizing a substrate, comprising:

between about 0.1 vol % and about 1 vol % of polyethylene oxide or polyethylene oxide derivative;

between about 0.3 vol % and about 3 vol % of ethylenediamine;

between about 0.5 vol % and about 5.0 vol % of hydrogen peroxide;

between about 0.02 vol % and about 0.1 vol % of benzotriazole;

about 5 vol % of isopropyl alcohol;

phosphoric acid to adjust a pH level between about 4 and about 8; and water.

2. The composition of claim 1, wherein the composition is abrasive-free.

3. The composition of claim 1, wherein the composition further comprises abrasive particles.

4. The composition of claim 3, wherein the abrasive particles comprise about 10 wt. % or less of the composition.

5. The composition of claim 3, wherein the abrasive particles comprise about 1 wt. % or less of the composition.

* * * * *